(12) United States Patent
Wada et al.

(10) Patent No.: US 7,645,563 B2
(45) Date of Patent: Jan. 12, 2010

(54) PHOTOSENSITIVE RESIN COMPOSITION, PHOTOSENSITIVE LAYER USING THE SAME AND PHOTOSENSITIVE RESIN PRINTING ORIGINAL PLATE

(75) Inventors: Toru Wada, Shiga (JP); Tomonori Hiramatsu, Osaka (JP); Akira Tomita, Shiga (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 402 days.

(21) Appl. No.: 10/552,596

(22) PCT Filed: Apr. 7, 2004

(86) PCT No.: PCT/JP2004/004981
§ 371 (c)(1),
(2), (4) Date: Dec. 26, 2006

(87) PCT Pub. No.: WO2004/090638
PCT Pub. Date: Oct. 21, 2004

(65) Prior Publication Data
US 2007/0117039 A1  May 24, 2007

(30) Foreign Application Priority Data
Apr. 7, 2003 (JP) ............................. 2003-103021
Mar. 31, 2004 (JP) ............................. 2004-103509

(51) Int. Cl.
*G03F 7/033* (2006.01)
(52) U.S. Cl. .............. 430/281.1; 430/287.1; 430/286.1; 430/300; 430/306; 430/285.1; 430/288.1; 430/907; 430/910; 430/905; 522/112
(58) Field of Classification Search .................. None
See application file for complete search history.

(56) References Cited
U.S. PATENT DOCUMENTS 5,916,732 A * 6/1999 Sasashita et al. ......... 430/287.1
6,197,479 B1  3/2001 Tanaka et al.

FOREIGN PATENT DOCUMENTS

| EP | 0 130 804 B1 | 2/1989 |
| EP | 0 967 523 A1 | 12/1999 |
| EP | 1013710 A1 * | 6/2000 |
| EP | 1 156 369 A1 | 11/2001 |
| JP | 09-031337 A | 2/1997 |
| JP | 10-148930 A | 6/1998 |
| JP | 2000-155417 A | 6/2000 |
| JP | 2000-214594 A | 8/2000 |
| JP | 2002-062639 A | 2/2002 |

OTHER PUBLICATIONS

Goodman et al, Chapter 2 of INtroduction to Polymer Science and Technology: An SPE Textbook, ed Kauman et al, A Wiley-INterscience Publication, New York, NY, Front fly pages and pp. 25, 56-60., received in the USPTO on Dec. 19, 1978.*
English translation of JP, 2002-062639 A (2002) from machine translation from AIPN Japan Patent Office Natinal center for Industrial Property Information and Training, generated Sep. 22, 2008, 14 pages.*
English translation of JP, 10-148930 A (1998) from machine translation from AIPN Japan Patent Office Natinal center for Industrial Property Information and Training, generated Sep. 22, 2008, 14 pages.*
English translation of JP, 09-031337 A (1997) from machine translation from AIPN Japan Patent Office Natinal center for Industrial Property Information and Training, generated Sep. 22, 2008, 7 pages.*
English translation of JP, 2000-214594 A (2000) from machine translation from AIPN Japan Patent Office Natinal center for Industrial Property Information and Training, generated Sep. 22, 2008, 14 pages.*

* cited by examiner

*Primary Examiner*—Cynthia Hamilton
(74) *Attorney, Agent, or Firm*—Leydig, Voit & Mayer, Ltd.

(57) ABSTRACT

The present invention is to obtain without any trouble a photosensitive resin composition, a photosensitive layer and a photosensitive resin printing original plate, which are developable with an aqueous developer, resistant to an aqueous ink and a cosolvent ink, and assured of good image reproducibility. The present invention relates to a photosensitive resin composition comprising (A) hydrophobic polymers obtained from at least two or more water dispersion latexes, (B) a photopolymerizable compound and (C) a photopolymerization initiator, wherein the two or more hydrophobic polymers each is present in a fine particle state.

20 Claims, No Drawings

PHOTOSENSITIVE RESIN COMPOSITION, PHOTOSENSITIVE LAYER USING THE SAME AND PHOTOSENSITIVE RESIN PRINTING ORIGINAL PLATE

TECHNICAL FIELD

The present invention relates to a photosensitive resin composition and a photosensitive resin printing original plate using the composition. More specifically, the present invention relates to a photosensitive resin composition for printing and a printing original plate, which are developable with an aqueous developer and excellent in image reproducibility.

BACKGROUND ART

A photosensitive resin composition in which an elastomer such as chlorinated rubber, styrene-butadiene block copolymer and polyurethane is used as a simple resin component and blended with an ethylene-based unsaturated compound and a photopolymerization initiator is useful as a flexographic printing plate material by making use of characteristics of the elastomer, and many proposals have been heretofore made thereon.

Particularly, as for a flexographic printing material developable with an aqueous developer and imparted with resistance to an aqueous ink, there has been proposed a phase structure where a particle having a phase 1 mainly comprising a hydrophobic polymer and a phase 2 mainly comprising a hydrophilic polymer forms a dispersion phase, and a phase having a hydrophilic component and a hydro-phobic component forms a continuous phase (see, for example, JP 03-136052 A).

However, in such a phase structure, a solid rubber is used in the dispersion phase and the continuous phase and, therefore, fine particles tend to aggregate at the stage of forming the phase structure to yield a dispersion phase having a large and non-uniform particle diameter, which gives rise to problems that light transmitted is scattered and image reproducibility of a fine relief is deteriorated.

Therefore, in order to form a dispersion phase having a fine particle diameter, techniques of dispersing, as the dispersion phase, a hydrophilic copolymer synthesized by emulsion polymerization or a polymer obtained from a water dispersion latex, in a hydrophilic photopolymerizable monomer have been proposed (see, for example, JP 2002-162731 A and JP 2000-155417 A).

The dispersion phase can be formed as a fine particle by such methods. However, in each of these methods, a solid rubber is used in the continuous phase occupying a large portion and, therefore, fine particles tend to aggregate at the stage of forming the phase structure to yield a dispersion phase having a large and non-uniform particle diameter, which gives rise to problems that light transmitted is scattered and image reproducibility of a fine relief is deteriorated.

The present invention has been made by taking account of these problems, and an object of the present invention is to obtain a photosensitive resin composition and a photosensitive resin printing original plate, which are developable with an aqueous developer, resistant to an aqueous ink and a cosolvent ink, and assured of good image reproducibility.

DISCLOSURE OF THE INVENTION

As a result of extensive studies and investigations to attain the above-described object, the present inventors have at last accomplished the present invention. That is, the present invention includes:

(1) A photosensitive resin composition comprising (A) hydrophobic polymers obtained from at least two or more water dispersion latexes, (B) a photopolymerizable compound and (C) a photopolymerization initiator, wherein the two or more hydrophobic polymers each is present in a fine particle state;

(2) The photosensitive resin composition as described in (1) above, wherein the particle diameter distribution of the fine particles as the component (A) has two or more peaks and the ratio of respective particle diameters at the peaks is 2 times or more;

(3) The photosensitive resin composition as described in (1) above, which further comprises (D) a hydrophilic polymer;

(4) The photosensitive resin composition as described in (3) above, wherein at least one hydrophobic polymer out of the component (A) and the hydrophilic polymer as the component (D) have a common skeleton structure;

(5) The photosensitive resin composition as described in (1) above, which further comprises (E) a viscosity adjusting agent;

(6) The photosensitive resin composition as described in (5) above, wherein the component (E) is a carboxylic acid-based copolymer;

(7) The photosensitive resin composition as described in (1) above, which further comprises (F) an aggregation inhibitor;

(8) The photosensitive resin composition as described in (7) above, wherein the component (F) is a nonionic surfactant;

(9) The photosensitive resin composition as described in (1) above, which further comprises (G) a conjugated diene oligomer having no crosslinking group;

(10) The photosensitive resin composition as described in (9) above, wherein the molecular weight of the component (G) is from 500 to 10,000;

(11) The photosensitive resin composition as described in any one of (1) to (10) above, wherein at least one member out of the component (B) is an alkyl methacrylate;

(12) The photosensitive resin composition as described in (11) above, wherein the alkyl methacrylate in the component (B) is a linear alkyl methacrylate having a carbon number of 8 to 18;

(13) A photosensitive resin composition layer obtained from the photosensitive resin composition described in (1) above, the layer having a percentage change of 30% or less in the compressive elasticity between before and after dipping in a cosolvent and having a swelling ratio of 16% or less; and

(14) A photosensitive resin printing original plate comprising a support having coated thereon a photosensitive layer comprising the photosensitive resin composition described in any one of (1) to (12) above.

By using the photosensitive resin composition of the present invention, a flexographic printing original plate developable with an aqueous developer, resistant to an aqueous ink and assured of good image reproducibility can be obtained. Therefore, the present invention greatly contributes to the industry.

The present invention is described in detail below.

The water dispersion latex used as the component (A) in the present invention is obtained by dispersing, as the dispersoid, polymer particles in water and additionally contains a surfactant and the like. Also, the hydrophobic polymers obtained from at least two or more water dispersion latexes each comprises a hydrophobic polymer obtained after removing water from the above-described water dispersion latex and slightly contains a surfactant and the like. In the present invention, it is necessary to use two or more such hydrophobic polymers.

The component (A) is specifically latexes selected from at least two or more kinds in the following: a water dispersion latex polymer such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine polymer latex, butyl polymer latex, thiokol polymer latex and acrylate polymer latex, and a polymer obtained by copolymerizing such a polymer with other components (e.g., acrylic acid, methacrylic acid). Among these, a water dispersion latex polymer having a butadiene skeleton or an isoprene skeleton in the molecular chain is preferred in view of hardness and rubber elasticity. More specifically, a polybutadiene latex, a styrene-butadiene copolymer latex, an acrylonitrile-butadiene copolymer latex, a methyl methacrylate-butadiene copolymer latex and a polyisoprene latex are preferred.

In the present invention, the component (A) must be present in a fine particle state, and it is preferred that the particle diameter distribution of fine particles has two or more peaks and that the ratio of the respective particle diameters at the peaks is 2 times or more. In particular, the lower limit of the ratio of the particle diameters is preferably about 3 times or more, more preferably 5 times or more, and the upper limit is preferably about 20 times or less, more preferably 15 times or less. The phrase "present in a fine particle state" means that when the observation of morphology and the assessment of phase distribution are performed by using a scanning probe microscope SPM, presence as an independent fine particle can be confirmed.

The above-mentioned particle diameter distribution may be satisfied by a dispersion state of a single hydrophobic polymer. Alternatively, in the case where two or more hydrophobic polymers each have a particle diameter distribution with one peak, it may suffice if the ratio of the respective particle diameters at the peaks is 2 times or more. In the present invention, it is preferred that one fine particle and another fine particle having a particle diameter of about two or more times the average particle diameter of the one fine particle are present. For example, a hydrophobic polymer ($\alpha$) has an average particle diameter of 0.02 to 0.5 μm, preferably from 0.04 to 0.3 μm, whereas a hydrophobic polymer ($\beta$) preferably has a particle diameter of 2 times or more, particularly preferably 3 times or more, the particle diameter of the hydrophobic polymer ($\alpha$), and the particle diameter thereof is from 0.1 to 0.7 μm, preferably from 0.2 to 0.5 μm.

Furthermore, the fine particles as the component (A) are preferably dispersed in the photopolymerizable compound as the component (B) or in the photopolymerization initiator as the component (C).

In the present invention, the photopolymerizable compound as the component (B) is preferably a photo-polymerizable oligomer. The photopolymerizable oligomer is a polymer in which an ethylenically unsaturated group is bonded to the terminal and/or the side chain of a conjugated diene-based polymer, and this is a polymer having a number average molecular weight of 1,000 to 10,000. More specifically, the photopolymerizable oligomer indicates a compound having the following structure in the molecular structure.

A conjugated diene-based polymer constituting the conjugated diene-based ethylenic polymer comprises a homopolymer of a conjugated diene unsaturated compound or a copolymer of a conjugated diene unsaturated compound and a monoethylenically unsaturated compound. Examples of the homopolymer of a conjugated diene unsaturated compound and the copolymer of a conjugated diene unsaturated compound and a monoethylenically unsaturated compound include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-isoprene copolymer, an acrylonitrile-isoprene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, a methyl acrylate-chloroprene copolymer, an acrylonitrile-butadiene-styrene copolymer and an acrylonitrile-chloroprene-styrene copolymer. Among these, in view of rubber elasticity and photocurability, a butadiene polymer, an isoprene polymer and an acrylonitrile-butadiene copolymer are preferred, and a butadiene polymer and an isoprene polymer are more preferred.

The method of introducing an ethylenically unsaturated group into the terminal and/or the side chain of a conjugated diene-based polymer is not particularly limited, but examples thereof include (1) a method where to a hydroxyl group at the terminal of a hydroxyl group-terminated conjugated diene-based polymer obtained by using hydrogen peroxide as a polymerization initiator, a monoethylenically unsaturated carboxylic acid such as (meth)acrylic acid is ester-bonded through dehydration or a monoethylenically unsaturated carboxylic acid alkyl ester such as methyl (meth)acrylate or ethyl (meth)acrylate is ester-bonded through transesterification, and (2) a method where an ethylenically unsaturated alcohol such as allyl alcohol and vinyl alcohol is reacted with a conjugated diene-based polymer obtained by copolymerizing a conjugated diene compound and an ethylenically unsaturated compound at least partially containing an unsaturated carboxylic acid (ester).

The amount of the ethylenically unsaturated group in the conjugated diene-based ethylenic polymer is preferably from 0.005 to 2.0 m-equivalent/g, particularly preferably from 0.01 to 2.0 m-equivalent, based on the polymer. If the amount of the ethylenically unsaturated group in the polymer exceeds 2.0 m-equivalent/g, too high hardness results and a satisfactory elasticity can be hardly obtained, whereas if it is less than 0.005 m-equivalent/g, the reactivity tends to becomes low and the image reproducibility tends to be deteriorated.

The content of the component (B) is preferably from 1 to 200 parts by weight per 100 parts by weight of the component (A). If the content of the component (B) is less than 1 part by weight, the raw plate is hardened and cannot be developed with an aqueous developer, whereas if it exceeds 200 parts by weight, the raw plate becomes excessively soft and is disadvantageously worsened in the handleability.

In the present invention, at least one member out of the component (B), in addition to the above, is preferably an alkyl methacrylate so as to elevate the mechanical strength of the printing plate and enhance the printing durability. Particularly, the alkyl methacrylate is preferably a linear alkyl methacrylate having a carbon number of 8 to 18.

Specific examples thereof include an alkyl(meth)acrylate such as methyl(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate and stearyl(meth)acrylate; a cycloalkyl(meth)acrylate such as cyclohexyl(meth)acrylate; a halogenated alkyl(meth)acrylate such as chloroethyl(meth)acrylate and chloropropyl (meth)acrylate; an alkoxyalkyl(meth)acrylate such as methoxyethyl(meth)acrylate, ethoxyethyl(meth)acrylate and butoxyethyl(meth)acrylate; and a phenoxyalkyl(meth)acrylate such as phenoxyethyl(meth)acrylate and nonylphenoxyethyl(meth)acrylate. Among these, preferred are an n-lauryl methacrylate, an alkyl (C12 to 13) methacrylate, a tridecyl methacrylate and an alkyl (C12 to 15) methacrylate.

The content of the alkyl methacrylate is preferably from 1 to 50 parts by weight, particularly preferably from 5 to 10 parts by weight, per 100 parts by weight of the component (A). If the alkyl methacrylate content is less than 1 part by weight, the exposed plate is not satisfied in the mechanical strength, whereas if it exceeds 50 parts by weight, the methyl methacrylate bleeds out to the surface of the photosensitive resin composition layer and does not allow for easy separation of the cover film and this is not preferred.

In the photosensitive resin composition of the present invention, a photopolymerization initiator is added as the component (C). As for the photopolymerization initiator, those capable of polymerizing a polymerizable carbon-carbon unsaturated group by the effect of light all can be used. Among these, a photopolymerization initiator having a function of absorbing light to produce a radical through autolysis or hydrogen desorption is preferred. Examples thereof include benzoin alkyl ethers, benzo-phenones, anthraquinones, benzils, acetophenones and diacetyls. The blending amount of the photopolymerization initiator is preferably from 0.1 to 50 parts by weight per 100 parts by weight of the component (A). With a blending amount of 0.1 parts by weight or more, good image reproducibility is obtained without decreasing polymerization initiation efficiency. With a blending amount of 50 parts by weight or less, the sensitivity is not too high and the exposure time is easy to control, hence it being preferred.

In the present invention, if desired, a hydrophilic polymer may be blended as the component (D). The hydrophilic polymer is preferably a polymer having a hydrophilic group such as —COOH, —COOM (wherein M is a monovalent, divalent or trivalent metal ion or a substituted or unsubstituted ammonium ion), —OH, —NH$_2$, —SO$_3$H and phosphoric acid ester group. Specific examples thereof include a polymer of (meth)acrylic acid or its salts, a copolymer of (meth)acrylic acid or its salts and alkyl(meth)acrylate, a copolymer of (meth)acrylic acid or its salts and styrene, a copolymer of (meth)acrylic acid or its salts and vinyl acetate, a copolymer of (meth)acrylic acid or its salts and vinyl acetate, a copolymer of (meth)acrylic acid or its salts and acrylonitrile, a polyvinyl alcohol, a carboxymethyl cellulose, a polyacrylamide, a hydroxyethyl cellulose, a polyethylene oxide, a polyethyleneimine, a polyurethane having a —COOM group, a polyureaurethane having a —COOM group, a polyamide acid having a —COOM group, and salts or derivatives thereof. These hydrophilic polymers may be used singly or in combination of two or more thereof.

The content of the component (D) is preferably from 0.1 to 50 parts by weight, particularly preferably from 0.1 to 30 parts by weight, per 100 parts by weight of the component (A). If the content of the component (D) is less than 0.1 part by weight, the development with an aqueous developer takes time, whereas if it exceeds 50 parts by weight, swelling with water increases and the resistance to an aqueous ink is disadvantageously worsened.

In the present invention, when a hydrophilic polymer as the component (D) is blended, at least one hydrophobic polymer (α) or (β) out of the component (A) and the hydrophilic polymer as the component (D) preferably have a common skeleton structure. Examples of the common skeleton structure include an acrylonitrile-butadiene structure and a butadiene structure. In the present invention, for example, a structure where a fine particulate hydrophobic polymer (β) is present in the continuous phase, and a hydrophilic polymer and a fine particulate hydrophobic polymer (α) having a common structure are present in the dispersion phase, is preferred.

The viscosity adjusting agent as the component (E) of the present invention is used to thicken the dope prepared and prevent vent-up in a concentrator. The viscosity adjusting agent is preferably a carboxylic acid-based copolymer, and the type thereof includes powder, aqueous solution, emulsion and reversed-phase emulsion. Among these, an emulsion type is preferred. Examples of the viscosity adjusting agent generally available on the market include, but are not limited to, Aron A-7070, Aron A-7050, Aron B-300, Aron B-500 and Aron B-700 (all produced by Toagosei Co., Ltd.). These viscosity adjusting agents may be used singly or in combination of two or more thereof. The blending amount of the viscosity adjusting agent is preferably from 0.1 to 10 parts by weight, particularly preferably from 0.5 to 5 parts by weight, per 100 parts by weight of the component (A). If the blending amount of the viscosity adjusting agent is less than 0.1 part by weight, the dope viscosity is not satisfactorily high and bumping occurs when the dope is concentrated, whereas if it exceeds 10 parts by weight, this disadvantageously causes extensive swelling of a relief with water and alcohol. In the present invention, the viscosity of the dope obtained is preferably 15 poises or more, particularly preferably 18 poises or more.

The aggregation inhibitor as the component (F) of the present invention is used to prevent solid-liquid separation due to abrupt aggregation among latex particles, which occurs at the preparation of a dope. The aggregation inhibitor is preferably a nonionic surfactant, particularly preferably a nonionic surfactant having a carbon number of 12 to 15 and an HLB value near 12. More specifically, examples of the hydrophilic group in the molecular structure include a polyoxyalkylene chain structure such as polyoxyethylene, polyoxymethylene and polyoxypropylene. As for the type of the hydrophobic group in the molecular structure, examples thereof include a nonylphenol type, a tridecyl alcohol type, a lauryl alcohol type, a secondary alcohol type and an oxoalcohol type. Examples of the aggregation inhibitor generally available on the market include, but are not limited to, Noigen EA-120, Noigen EA-120B, DKS NL-70, DKS NL-80, Noigen ET-143L, Noigen TDS-70, Noigen ET-115, Noigen ET-116B, Noigen ET-116B, Noigen ET-116C, Noigen ET-147, Noigen ET-157, Noigen SD-60, Noigen SDX-60, DKS NL-Dash 408 and DKS NL-Dash 410 (Dai-Ichi Kogyo Seiyaku Co., Ltd.). These may be used singly or in combination of two or more thereof. The blending amount of the aggregation inhibitor is preferably from 0.01 to 10 parts by weight, particularly preferably from 0.1 to 1 part by weight, per 100 parts by weight of the component (A). If the blending amount of the aggregation inhibitor is less than 0.01 part by weight, this is insufficient to prevent solid-liquid separation due to abrupt aggregation of latex particles after charging the hydrophilic polymer, whereas if it exceeds 10 parts by weight, extensive swelling of a relief with water and alcohol occurs disadvantageously.

The conjugated diene oligomer having no crosslinking group as the component (G) of the present invention is used to decrease the crosslinking density of the photosensitive resin composition layer, adjust the absorption of a cosolvent and the extraction of an oligomer component, which take place at printing using a cosolvent ink, and reduce the percentage change in the apparent weight. The conjugated diene oligomer having no crosslinking group is preferably a conjugated diene-based oligomer having no crosslinking group and having at lest a 1,2-butadiene skeleton. The molecular weight of the conjugated diene-based oligomer having no crosslinking group and having a 1,2-butadiene skeleton is preferably from 500 to 10,000, particularly preferably from 1,000 to 5,000, still more preferably from 1,000 to 4,000. If the molecular weight is less than 500, not only the resin plate is worsened in the handleability but also a large amount of an oligomer component is extracted in the cosolvent contained in the cosolvent ink and disadvantageously causes a problem, for example, the strength of the plate is impaired or the hardness of the plate changes in the course of repeated printing to give non-uniform finishing of the printed matter. Also, if the molecular weight exceeds 10,000, the expected reduction in the percentage change of weight after dipping in a cosolvent is not obtained or the compatibility with the photosensitive resin component is impaired and, therefore, this is not preferred.

Examples of the conjugated diene-based oligomer having a 1,1-butadiene skeleton include a polybutadiene oligomer with no terminal functional group, a polystyrene-butadiene oligomer, a polyacrylonitrile-butadiene oligomer, a polyisoprene oligomer, a polychloroprene oligomer, a terminal allyl group-containing polybutadiene oligomer, a terminal allyl group-containing polystyrene-butadiene oligomer, a terminal allyl group-containing polyacrylonitrile-butadiene oligomer, a terminal allyl group-containing polyisoprene oligomer, a terminal allyl group-containing polychloroprene oligomer, a terminal hydroxyl group-containing polybutadiene oligomer, a terminal hydroxyl group-containing polystyrene-butadiene oligomer, a terminal hydroxyl group-containing polyacrylonitrile-butadiene oligomer, a terminal hydroxyl group-containing polyisoprene oligomer, a terminal hydroxyl group-containing polychloroprene oligomer, a terminal carboxyl group-containing polybutadiene oligomer, a terminal carboxyl group-containing polystyrene-butadiene oligomer, a terminal carboxyl group-containing polyacrylonitrile-butadiene oligomer, a terminal carboxyl group-containing polyisoprene oligomer, a terminal carboxyl group-containing polychloroprene oligomer, a terminal amino group-containing polybutadiene oligomer, a terminal amino group-containing polystyrene-butadiene oligomer, a terminal amino group-containing polyacrylonitrile-butadiene oligomer, a terminal amino group-containing polyisoprene oligomer and a terminal amino group-containing polychloroprene oligomer.

The content of the component (G) is from 1 to 200 parts by weight, preferably from 3 to 100 parts by weight, more preferably from 5 to 30 parts by weight, per 100 parts by weight of the component (A). If the content of the component (G) is less than 1 part by weight, the raw plate is hardened and cannot be developed with an aqueous developer, whereas if it exceeds 200 parts by weight, the raw plate becomes excessively soft and is disadvantageously worsened in the handleability.

In the photosensitive resin composition of the present invention, a plasticizer may be further added. The plasticizer is not particularly limited as long as it has a property of flexibilizing a plate material in general, but a plasticizer having good compatibility with the component (A) or the component (D) is preferred. The plasticizer is more preferably a polyene compound which is liquid at room temperature, or a compound having an ester bond. Examples of the polyene compound which is liquid at room temperature include a liquid polybutadiene, a liquid polyisoprene and a maleinated or epoxidized compound obtained by modifying the terminal group or the side chain thereof. Examples of the compound having an ester bond include a phthalic acid ester, a phosphoric acid ester, a sebacic acid ester, an adipic acid ester and a polyester having a molecular weight of 1,000 to 3,000.

In the case of adding such a plasticizer component, from the standpoint of assuring a sufficiently high strength as a solid plate before light crosslinking, the content of the plasticizer is preferably from 0 to 100 parts by weight per 100 parts by weight of the component (A).

In order to elevate the thermal stability of the photosensitive resin composition of the present invention, a conventionally known polymerization inhibitor may also be added. Preferred examples of the polymerization inhibitor include phenols, hydroquinones and catechols. The blending amount of the polymerization inhibitor is generally from 0.001 to 5 wt % based on the entire photosensitive resin composition.

As for other compounds, a dye, a pigment, a defoaming agent, an ultraviolet absorbent, a perfume and the like can be added.

The photosensitive layer obtained from the above-described photosensitive resin composition of the present invention preferably has a percentage change of 30% or less in the compressive elasticity between before and after dipping in a cosolvent and has a swelling ratio of 16% or less. The compressive elasticity is a value determined in a Tensilon compression test by plunging an ion rod having a diameter of 10 mm and measuring the load applied to give a displacement of 0.1 mm. The cosolvent swelling ratio is a value determined by measuring the percentage change of weight after dipping in a cosolvent for 24 hours. The cosolvent used is prepared by mixing an isopropyl alcohol blended in a general cosolvent ink and an n-propyl acetate at a weight ratio of 8:2.

The compression elasticity or swelling ratio as used in the present invention is specifically measured by a method where a protective film or a slip coat layer on the photosensitive resin composition layer of a 50 mm-square photosensitive printing original plate are, if there, stripped and removed, actinic rays are irradiated over the entire surface, the compressive elasticity or weight is measured before and after dipping in a solvent, and the percentage change thereof is calculated.

In the present invention, the percentage change in the compressive elasticity between before and after dipping in a cosolvent is preferably 30% or less, more preferably 25% or less, still more preferably 20% or less. Within this range, excellent printing durability is ensured in the long-run printing using a cosolvent ink.

In applying the photosensitive resin composition of the present invention, a support such as polyester may be provided on the side opposite the relief so as to maintain the precision as a printing plate. The photosensitive resin composition of the present invention exhibits tackiness depending on its formulation and in order to assure good. contacting property with a transparent image carrier (negative film) superposed thereon and enable re-use of the image carrier, a flexible film layer developable with an aqueous medium may be provided on the surface. The photosensitive resin composition of the present invention can be produced by mixing respective components. With respect to the means therefor, the resin composition may be mixed by using an extruder, a kneader or the like, and formed into a layer having a desired thickness by hot press molding, calendering or extrusion molding. The support or flexible film layer may be sheet-molded and then tightly contacted with the photosensitive layer by roll lamination. The support of flexible film layer after lamination may be heat-pressed to obtain a photosensitive layer with good precision. Examples of the actinic light source used for photocuring the photosensitive resin composition of the present invention include a low-pressure mercury lamp, a high-pressure mercury lamp, an ultraviolet fluorescent lamp, a carbon arc lamp, a xenon lamp, a zirconium lamp and sunlight. An image is formed by irradiating light on the photosensitive resin composition of the present invention through a transparent image carrier and the non-irradiated portion is removed (developed) with use of an aqueous developer, whereby a relief (printing plate) is obtained.

The aqueous developer as used in the present invention is prepared by blending a surfactant such as nonionic surfactant or anionic surfactant to water and, if desired, further adding thereto a pH adjusting agent, a washing accelerator and the like. Specific examples of the nonionic surfactant include a polyoxyalkylene alkyl or alkenyl ether, a polyoxyalkylene alkyl or alkenyl phenyl ether, a polyoxyalkylene alkyl or alkenyl amine, a polyoxyalkylene alkyl or alkenyl amide, and an ethylene oxide/propylene oxide block adduct. Specific examples of the anionic surfactant include a linear alkylbenzene sulfonate containing an alkyl having an average carbon number of 8 to 16, an $\alpha$-olefin sulfonate having an average carbon number of 10 to 20, a dialkyl sulfosuccinate containing an alkyl or alkenyl group having a carbon number of 4 to 10, a sulfonate of fatty acid lower alkyl ester, an alkyl sulfate having an average carbon number of 10 to 20, an alkyl ether sulfate containing a linear or branched alkyl or alkenyl group having a average carbon number of 10 to 20, in which an ethylene oxide of 0.5 to 8 mol on average is added, and a saturated or unsaturated fatty acid salt having an average carbon number of 10 to 22.

Examples of the pH adjusting agent include sodium borate, sodium carbonate, sodium silicate, sodium metasilicate, sodium succinate and sodium acetate. Among these, sodium silicate is preferred because of its easy dissolvability in water. Furthermore, a washing aid may be also blended but the washing ability is enhanced by using it in combination with the above-described surfactant or pH adjusting agent. Specific examples of the washing aid include amines such as monoethanolamine, diethanolamine and triethanolamine, ammonium salts such as tetramethylammonium hydroxide, and paraffin-based hydrocarbons. The washing aid is used by adding and mixing it to water at an appropriate mixing ratio within the range from 0.1 to 50 wt %, preferably from 1 to 10 wt %. The plate after development is generally dried in an oven at about 60° C. for 15 to 120 minutes.

The photosensitive resin composition of the present invention sometimes allows for remaining of stickiness on the plate surface even after the completion of drying, depending on its formulation. In such a case, the stickiness can be removed by a known surface treatment method. The surface treatment method is preferably an exposure treatment with actinic rays at a wavelength of 300 nm or less.

The photosensitive resin composition of the present invention is optimally used for flexographic printing but may also be used as a photoresist for resin relief printing, lithographic printing, intaglio printing or screen printing.

EXAMPLES

The present invention is illustrated in greater detail with reference to the following Examples and Comparative Examples, but the present invention is not limited thereto.

The characteristic values in the Examples are values obtained by the following measuring methods.

(1) Measurement of Average Particle Diameter of Fine Particles:

a) Production of Sample:

The obtained photosensitive resin printing original plate was exposed by irradiating a chemical lamp (manufactured by A & V; the lamp installed was Phillips 10R) on front and back surfaces each for 10 minutes, the cover film and the antiblocking layer were stripped off, the cured photosensitive layer was sectioned in the frozen state by using an ultramicrotome and after drying, the section surface, namely, internal structure, was evaluated by using a scanning probe microscope SPM.

The SPM used was SPA300 (manufactured by Seiko Instruments, SPI3800N System). The measurement mode was DMF mode and the cantilever used was DF3. At the same time with the morphology observation by DFM mode, the phase image was observed.

b) Measurement of Particle Diameter:

The phase difference image was subjected to automatic binarization according to TOKS process by using an image processing apparatus, Image Analyzer V20, manufactured by Toyobo Co., Ltd., thereby distinguishing the particle portion as white and the remaining as black, and after determining the equivalent-circle diameter of the white portion, a particle diameter distribution or an average particle diameter was calculated therefrom.

(2) Hardness:

This is a value measured at 20° C. by the Spring-Type Hardness Test (Form A) Method according to JIS-K6301.

(3) Repulsive Elasticity:

A steel-made ball of $\phi 10$ m/m (weight: 4.16 g) was dropped from the height of 20 cm and by reading the bounce height (a), the repulsive elasticity was expressed as $(a/20) \times 100\%$.

(4) Swelling Ratio:

After the printing plate was dipped in water or ethanol at 20° C. for 1 hour or 24 hours, the percentage increase (%) of weight was measured.

(5) Cosolvent Swelling Ratio:

After the printing plate was dipped in the cosolvent (isopropyl alcohol/n-propyl acetate=8/2) at 20° C. for 24 hours, the percentage increase (%) of weight was measured.

(6) Light Scattering Ratio:

The light scattering ratio at $\lambda=365$ nm of the photosensitive resin composition was measured by using a spectrophotometer (U-3210, manufactured by Hitachi, Ltd., with a 150$\phi$ integrating sphere attachment).

(7) Tensile Product:

This is a value obtained by multiplying the elongation and the strength when the printing plate was drawn with a mold and measured according to a Tenslion (using a cross-head of 100 kg) tensile test.

(8) Dope Viscosity:

This is a value obtained by measuring the viscosity of the prepared dope at 20° C. with use of a vibration viscometer (VM-1G-MH, manufactured by CBC Materials Co., Ltd.).

(9) Compressive Elasticity:

The printing plate was subjected to a Tensilon compression test and by plunging an ion rod having a diameter of 10 mm, the load applied to give a displacement of 0.1 mm was measured. The same measurement was performed also after dipping in a cosolvent (isopropyl alcohol/n-propyl acetate=8/2) at 20° C. for 24 hours.

Example 1

10 Parts by weight of a hydrophobic polymer ($\alpha$): acrylonitrile-butadiene latex (Nipol SX1503, produced by Zeon Corp., nonvolatile content: 42%) and 58 parts by weight of a hydrophobic polymer (β): butadiene latex (Nipol LX111NF, produced by Zeon Corp., nonvolatile content: 55%) as the component (A), 28 parts by weight of an oligobutadiene acrylate (ABU-2S, produced by Kyoeisha Chemical Co., Ltd.), 4 parts by weight of a lauryl methacrylate (Light Ester L, produced by Kyoeisha Chemical Co., Ltd.) and 4 parts by weight of a dimethylol-tricyclodecane diacrylate as the component (B), 1 part by weight of a photopolymerization initiator as the component (C), 0.1 part by weight of a hydroquinone monomethyl ether as the polymerization inhibitor, and 0.1 part by weight of a nonionic surfactant as the other additive were mixed together with 15 parts by weight of toluene in a vessel and then kneaded at 105° C. by using a pressure kneader. Thereafter, toluene and water were removed under reduced pressure to obtain a photosensitive resin composition.

The obtained photosensitive resin composition was sandwiched between a film obtained by coating a polyester-based adhesive layer on a 125 μm-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C. under a pressure of 100 kg/cm$^2$ for 1 minute, whereby a 1.7 mm-thick photosensitive resin original plate was produced. Incidentally, when the particle diameter distribution and the average particle diameter of hydrophobic polymer fine particles in the photosensitive resin layer of the photosensitive resin original plate were measured by the above-described method, two peaks of 0.115 μm and 0.370 μm were present in the particle diameter distribution and the ratio of these particle diameters was about 3 times.

The obtained original plate was separated and after placing thereon a test negative film containing a 200-line halftone of 1 to 95%, a minimum isolated dot having a diameter of 100 μm, a minimum convex letter of 1 point, a minimum concave letter of 1 point, a solid image and a step guide, back exposure and front-exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 10 minutes.

The obtained printing plate had a relief depth of 0.8 mm and when used for printing with an aqueous ink, image reproducibility unrealizable by a conventional flexographic printing plate was obtained in which a 200-line halftone of 1 to 95%, a minimum isolated dot diameter of 100 μm, a minimum isolated line width of 30 μm, a minimum concave line width of 100 μm, a minimum convex letter of 1 point, and a minimum concave letter of 1 point were reproduced. Even when a printing test of 1,000,000 sheets was performed by using the printing plate, no change was observed in the image reproducibility. Also, the obtained printing plate had a Shore A hardness of 58, a repulsive elasticity of 65%, a water swelling ratio after 24 hours of 3.1%, an ethanol swelling ratio after 24 hours of 5.8%, a light scattering ratio at 365 nm of 10.9%, and a tensile product of 260 (elongation 1.14×strength 229).

Example 2

10 Parts by weight of a hydrophobic polymer (α): acrylonitrile-butadiene latex (Nipol SX1503, produced by Zeon Corp., nonvolatile content: 42%) and 62 parts by weight of a hydrophobic polymer (β): butadiene latex (Nipol LX111NF, produced by Zeon Corp., nonvolatile content: 55%) as the component (A), 30 parts by weight of an oligobutadiene acrylate (ABU-2S, produced by Kyoeisha Chemical Co., Ltd.), 4 parts by weight of a lauryl methacrylate (Light Ester L, produced by Kyoeisha Chemical Co., Ltd.) and 4 parts by weight of a dimethylol-tricyclodecane diacrylate as the component (B), 1 part by weight of a photopolymerization initiator as the component (C), 18 parts by weight of a hydrophilic polymer (PFT-3, produced by Kyoeisha Chemical Co., Ltd., nonvolatile content: 25%) as the component (D), 0.1 part by weight of a hydroquinone monomethyl ether as the polymerization inhibitor, and 0.1 part by weight of a nonionic surfactant as the other additive were mixed together with 15 parts by weight of toluene in a vessel and then kneaded at 105° C. by using a pressure kneader. Thereafter, toluene and water were removed under reduced pressure to obtain a photosensitive resin composition.

The obtained photosensitive resin composition was sandwiched between a film obtained by coating a polyester-based adhesive layer on a 125 μm-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C under a pressure of 100 kg/cm$^2$ for 1 minute, whereby a 1.7 mm-thick photosensitive resin original plate was produced. Incidentally, when the particle diameter distribution and the average particle diameter of hydrophobic polymer fine particles in the photosensitive resin layer of the photosensitive resin original plate were measured by the above-described method, two peaks of 0.115 μm and 0.370 μm were present in the particle diameter distribution and the ratio of these particle diameters was about 3 times.

The obtained original plate was separated and after placing thereon a test negative film containing a 200-line halftone of 1 to 95%, a minimum isolated dot having a diameter of 100 μm, a minimum convex letter of 1 point, a minimum concave letter of 1 point, a solid image and a step guide, back exposure and front exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 10 minutes to obtain a printing plate.

The obtained printing plate had a relief depth of 0.8 mm and when used for printing with an aqueous ink, image reproducibility unrealizable by a conventional flexographic printing plate was obtained in which a 200-line halftone of 1 to 95%, a minimum isolated dot diameter of 100 μm, a minimum isolated line width of 30 μm, a minimum concave line width of 100 μm, a minimum convex letter of 1 point, and a minimum concave letter of 1 point were reproduced. Even when a printing test of 1,000,000 sheets was performed by using the printing plate, no change was observed in the image reproducibility. Also, the obtained printing plate had a Shore A hardness of 63, a repulsive elasticity of 60%, a water swelling ratio after 24 hours of 5.5%, an ethanol swelling ratio after 24 hours of 5.0%, a light scattering ratio at 365 nm of 15.5%, and a tensile product of 280 (elongation 1.19×strength 235).

Example 3

62 Parts by weight of a butadiene latex (Nipol LX111NF, produced by Zeon Corp., nonvolatile content: 55%) and 10 parts by weight of an acrylonitrile-butadiene latex (Nipol SX1503, produced by Zeon Corp., nonvolatile content: 43%) as the component (A), 30 parts by weight of an oligobutadiene acrylate (ABU-2S, produced by Kyoeisha Chemical Co., Ltd.) as the component (B), 0.45 parts by weight of a photopolymerization initiator as the component (C), 18 parts by weight of a hydrophilic polymer (PFT-3, produced by Kyoeisha Chemical Co., Ltd., nonvolatile content: 25%) as the component (D), 1 part by weight of a viscosity adjusting agent (Aron A-7050, produced by Toagosei Co., Ltd.) as the component (E), 4 parts by weight of a lauryl methacrylate and 4 parts by weight of a dimethyloltricyclodecane diacrylate as the crosslinking agent, 0.03 parts by weight of a hydroquinone monomethyl ether as the polymerization inhibitor, and 0.04 parts by weight of a carboxylic acid-based copolymer as the other additive were mixed together with 15 parts by weight of toluene in a vessel, and the dope viscosity was measured. The dope was then kneaded at 105° C. by using a pressure kneader and thereafter, toluene and water were removed under reduced pressure. The obtained photosensitive resin composition was sandwiched between a film obtained by coating a polyester-based adhesive layer on a 125 µm-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C. under a pressure of 100 kg/cm$^2$ for 1 minute, whereby a 1.7 mm-thick photosensitive resin original plate was produced. The obtained original plate was separated and after placing thereon a test negative film containing a 200-line halftone of 1 to 95%, a minimum isolated dot having a diameter of 100 µm, a minimum convex letter of 1 point, a minimum concave letter of 1 point, a solid image and a step guide, back exposure and front exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 20 minutes to obtain a printing plate.

The obtained printing plate had a relief depth of 0.8 mm and when used for printing with an aqueous ink, image reproducibility unrealizable by a conventional flexographic printing plate was obtained in which a 200-line halftone of 1 to 95%, a minimum isolated dot diameter of 100 µm, a minimum isolated line width of 30 µm, a minimum concave line width of 100 µm, a minimum convex letter of 1 point, and a minimum concave letter of 1 point were reproduced. Even when a printing test of 1,000,000 sheets was performed by using the printing plate, no change was observed in the image reproducibility.

The viscosity of the prepared dope was 20 P, and the obtained printing plate had a Shore A hardness of 63, a repulsive elasticity of 60%, a water swelling ratio after 1 hour of 1.5%, an ethanol swelling ratio after 1 hour of 3.7%, a water swelling ratio after 24 hours of 5.7%, an ethanol swelling ratio after 24 hours of 5.2%, a light scattering ratio at 365 nm of 16.5%, and a tensile product of 280 (elongation 1.19× strength 235).

Example 4

62 Parts by weight of a butadiene latex (Nipol LX111NF, produced by Zeon Corp., nonvolatile content: 55%) and 10 parts by weight of an acrylonitrile-butadiene latex (Nipol SX1503, produced by Zeon Corp., nonvolatile content: 43%) as the component (A), 30 parts by weight of an oligobutadiene acrylate (ABU-2S, produced by Kyoeisha Chemical Co., Ltd.) as the component (B), 0.45 parts by weight of a photopolymerization initiator as the component (C), 18 parts by weight of a hydrophilic polymer (PFT-3, produced by Kyoeisha Chemical Co., Ltd., nonvolatile content: 25%) as the component (D), 0.3 parts by weight of an aggregation inhibitor (Noigen SDX-60, produced by Daiichi Kogyo Seiyaku Co., Ltd.) as the component (F), 4 parts by weight of a lauryl methacrylate and 4 parts by weight of a dimethyloltricyclodecane diacrylate as the crosslinking agent, 0.03 parts by weight of a hydroquinone monomethyl ether as the polymerization inhibitor, and 0.04 parts by weight of a carboxylic acid-based copolymer as the other additive were mixed together with 15 parts by weight of toluene in a vessel, and the state of the dope was observed immediately after the preparation and after 1 hour. The dope was then kneaded at 105° C. by using a pressure kneader and thereafter, toluene and water were removed under reduced pressure. The obtained photosensitive resin composition was sandwiched between a film obtained by coating a polyester-based adhesive layer on a 125 m-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C. under a pressure of 100 kg/cm$^2$ for 1 minute, whereby a 1.7 mm-thick photosensitive resin original plate was produced. The obtained original plate was separated and after placing thereon a test negative film containing a 200-line halftone of 1 to 95%, a minimum isolated dot having a diameter of 100 µm, a minimum convex letter of 1 point, a minimum concave letter of 1 point, a solid image and a step guide, back exposure and front exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 20 minutes to obtain a printing plate.

The obtained printing plate had a relief depth of 0.8 mm and when used for printing with an aqueous ink, image reproducibility unrealizable by a conventional flexographic printing plate was obtained in which a 200-line halftone of 1 to 95%, a minimum isolated dot diameter of 100 µm, a minimum isolated line width of 30 µm, a minimum concave line width of 100 µm, a minimum convex letter of 1 point, and a minimum concave letter of 1 point were reproduced. Even when a printing test of 1,000,000 sheets was performed by using the printing plate, no change was observed in the image reproducibility.

The-state of the dope was uniform and unchanged between immediately after the preparation and after 1 hour. The obtained printing plate had a Shore A hardness of 63, a repulsive elasticity of 60%, a water swelling ratio after 1 hour of 1.5%, an ethanol swelling ratio after 1 hour of 3.7%, a water swelling ratio after 24 hours of 5.5%, an ethanol swelling ratio after 24 hours of 5.0%, a light scattering ratio at 365 nm of 17.3%, and a tensile product of 280 (elongation 1.19× strength 235).

Example 5

62 Parts by weight of a butadiene latex (Nipol LX111NF, produced by Zeon Corp., nonvolatile content: 55%) and 10 parts by weight of an acrylonitrile-butadiene latex (Nipol SX1503, produced by Zeon Corp., nonvolatile content: 42%)

as the component (A), 20 parts by weight of an oligobutadiene acrylate (ABU-2S, produced by Kyoeisha Chemical Co., Ltd.) as the component (B), 0.45 parts by weight of a photopolymerization initiator as the component (C), 18 parts by weight of a hydrophilic polymer (PFT-3, produced by Kyoeisha Chemical Co., Ltd., nonvolatile content: 25%) as the component (D), 6 parts by weight of a conjugated diene oligomer having no crosslinking group (B2000, produced by Nippon Petrochemicals Co., Ltd.) as the component (G), 6 parts by weight of a lauryl methacrylate and 6 parts by weight of a dimethyloltricyclodecane diacrylate as the crosslinking agent, and 0.03 parts by weight of a hydroquinone monomethyl ether as the polymerization inhibitor were mixed together with 6 parts by weight of toluene in a vessel and then kneaded at 105° C. by using a pressure kneader. Thereafter, toluene and water were removed under reduced pressure. The obtained photosensitive resin composition was sandwiched between a film obtained by coating a polyester-based adhesive layer on a 125 μm-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C. under a pressure of 100 kg/cm$^2$ for 1 minute, whereby a 1.7 mm-thick photosensitive resin original plate was produced. The obtained original plate was separated and after placing thereon a test negative film containing a 200-line halftone of 1 to 95%, a minimum isolated dot having a diameter of 100 μm, a minimum convex letter of 1 point, a minimum concave letter of 1 point, a solid image and a step guide, back exposure and front exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 20 minutes to obtain a printing plate.

The obtained printing plate had a relief depth of 0.8 mm and when used for printing with an aqueous ink and a cosolvent ink, image reproducibility unrealizable by a conventional flexographic printing plate was obtained in which a 200-line halftone of 1 to 95%, a minimum isolated dot diameter of 100 μm, a minimum isolated line width of 30 μm, a minimum concave line width of 100 μm, a minimum convex letter of 1 point, and a minimum concave letter of 1 point were reproduced. Even when a printing test of 1,000,000 sheets was performed by using the printing plate, no change was observed in the image reproducibility. Also, the obtained printing plate had a Shore A hardness of 60, a repulsive elasticity of 57.5%, a water swelling ratio after 1 hour of 0.6%, an ethanol swelling ratio after 1 hour of 2.3%, a cosolvent swelling ratio after 1 hour of 3.8%, a water swelling ratio after 24 hours of 3.5%, an ethanol swelling ratio after 24 hours of 4.5%, a cosolvent swelling ratio after 24 hours of 11.5%, a light scattering ratio at 365 nm of 28%, and a tensile product of 255.

Furthermore, when the protective film and the antiblocking layer of the obtained photosensitive resin original plate were stripped to expose the photosensitive resin layer and then, back exposure and surface exposure were performed with use of an illuminance 17.5 W/m$^2$ at 365 nm (a lamp, FR20T12-BL-9-BP, manufactured by Anderson & Vreeland), the compressive elasticity of the obtained plate was 1.63 kgf, the compressive elasticity after dipping in the cosolvent for 24 hours was 1.37 kgf, the percentage change between before and after dipping was 15.4%, and the cosolvent swelling ratio after 24 hours was 11.5%.

Example 6

62 Parts by weight of a butadiene latex (Nipol LX111NF, produced by Zeon Corp., nonvolatile content: 55%) and 10 parts by weight of an acrylonitrile-butadiene latex (Nipol SX1503, produced by Zeon Corp., nonvolatile content: 43%) as the component (A), 20 parts by weight of an oligobutadiene acrylate (ABU-2S, produced by Kyoeisha Chemical Co., Ltd.), 6 parts by weight of a lauryl methacrylate (Light Ester L, produced by Kyoeisha Chemical Co., Ltd.) and 6 parts by weight of a dimethylol-tricyclodecane diacrylate as the component (B), 0.45 parts by weight of a photopolymerization initiator as the component (C), 18 parts by weight of a hydrophilic polymer (PFT-3, produced by Kyoeisha Chemical Co., Ltd., nonvolatile content: 25%) as the component (D), 1 part by weight of a viscosity adjusting agent (Aron A-7050, produced by Toagosei Co., Ltd.) as the component (E), 0.3 parts by weight of an aggregation inhibitor (Noigen SDX-60, produced by Dai-ichi Kogyo Seiyaku Co., Ltd.) as the component (F), 6 parts by weight of a conjugated diene oligomer having no crosslinking group (B2000, produced by Nippon Petrochemicals Co., Ltd.) as the component (G), and 0.03 parts by weight of a hydroquinone monomethyl ether as the polymerization inhibitor were mixed together with 15 parts by weight of toluene in a vessel, and the dope viscosity was measured. The dope was then kneaded at 105° C. by using a pressure kneader and thereafter, toluene and water were removed under reduced pressure. The obtained photosensitive resin composition was sandwiched between a film obtained by coating a polyester-based adhesive layer on a 125 μm-thick polyethylene terephthalate film and a film obtained by coating an antiblocking layer (polyvinyl alcohol) on the same polyethylene terephthalate film (so that the adhesive layer and the antiblocking layer could contact with the photosensitive resin composition), and pressed by a heat-press at 105° C. under a pressure of 100 kg/cm$^2$ for 1 minute, whereby a 1.7 mm-thick photosensitive resin original plate was produced. The obtained original plate was separated and after placing thereon a test negative film containing a 200-line halftone of 1 to 95%, a minimum isolated dot having a diameter of 100 μm, a minimum convex letter of 1 point, a minimum concave letter of 1 point, a solid image and a step guide, back exposure and front exposure were performed with use of an illuminance of 17.5 w/m$^2$ at 365 nm (a lamp, FR20T12-BL-9-BP, manufactured by Anderson & Vreeland). Subsequently, the negative film was removed, and the plate was developed with a neutral water containing 4 wt % of sodium alkylnaphthalenesulfonate at 40° C. for 8 minutes and then dried at 60° C. for 20 minutes to obtain a printing plate.

The obtained printing plate had a relief depth of 0.8 mm and when used for printing with an aqueous ink, image reproducibility unrealizable by a conventional flexographic printing plate was obtained in which a 200-line halftone of 1 to 95%, a minimum isolated dot diameter of 100 μm, a minimum isolated line width of 30 μm, a minimum concave line width of 100 μm, a minimum convex letter of 1 point, and a minimum concave letter of 1 point were reproduced. Even when a printing test of 1,000,000 sheets was performed by using the printing plate, no change was observed in the image reproducibility.

The viscosity of the prepared dope was 20 P and the obtained printing plate had a Shore A hardness of 60, a repulsive elasticity of 57.5%, a water swelling ratio after 1 hour of 1.5%, an ethanol swelling ratio after 1 hour of 3.7%, a water swelling ratio after 24 hours of 4.2%, an ethanol swelling ratio after 24 hours of 5.5%, a light scattering ratio at 365 nm of 17.5%, and a tensile product of 260. Also, the compressive elasticity of the obtained plate was 1.62 kgf, the compressive elasticity after dipping in the cosolvent for 24 hours was 1.37 kgf, the percentage change between before and after dipping was 15.2%, and the cosolvent swelling ratio after 24 hours was 11.4%.

Comparative Example 1

A photosensitive resin composition was obtained thoroughly in the same manner as in Example 2 except that 62 parts by weight of a solid polybutadiene (UBEPOL-BR130B, produced by Ube Industries, Ltd.) was blended in place of the hydrophobic polymer (β) butadiene latex as the component (A) in Example 2. After performing back exposure and front exposure, the negative film was removed and the plate was developed with a neutral water containing 4 wt % of sodium alkylnaphthalenesulfonate at 40° C. for 20 minutes, but only a relief depth of 0.4 mm could be obtained and breakage of halftone in the highlight area or plugging in the shadow area was generated, revealing significant deterioration in the image reproducibility.

Comparative Example 2

A flexographic printing plate was produced thoroughly in the same manner as in Example 2 except for not blending 10 parts by weight of the hydrophobic polymer (α): acrylonitrile-butadiene latex (Nipol SX1503, produced by Zeon Corp., nonvolatile content: 43%) as the component (A) in Example 2. That is, a flexographic printing plate was produced by using only the hydrophobic polymer (β) butadiene latex as the component (A). The obtained printing plate was developed for a time as long as 20 minutes but the relief depth did not reach 0.8 mm, resulting in development failure.

EFFECTS OF THE INVENTION

The photosensitive resin composition of the present invention is developable with an aqueous developer, resistant to an aqueous ink and a cosolvent ink, and usable for a flexographic printing original plate with good image reproducibility, and greatly contributes to the industry.

The invention claimed is:

1. A photosensitive resin composition comprising
    (A) hydrophobic polymers obtained from at least two or more water dispersion latexes,
    (B) a photopolymerizable compound
    (C) a photopolymerization initiator, and
    (D) a hydrophilic polymer,
    wherein
    each of said two or more hydrophobic polymers is present in a fine particle state in the uncured composition,
    the particle diameter distribution of the fine particles as the component (A) has two or more peaks, and
    the ratio of respective particle diameters at the peaks is 2 times or more.

2. The photosensitive resin composition as claimed in claim 1, wherein at least one hydrophobic polymer out of the component (A) and the hydrophilic polymer as the component (D) have a common skeleton structure.

3. A photosensitive resin printing original plate comprising a support having coated thereon a photosensitive layer comprising the photosensitive resin composition claimed in claim 2.

4. The photosensitive resin composition as claimed in claim 1, which further comprises (E) a viscosity adjusting agent.

5. The photosensitive resin composition as claimed in claim 4, wherein the component (E) is a carboxylic acid copolymer.

6. A photosensitive resin printing original plate comprising a support having coated thereon a photosensitive layer comprising the photosensitive resin composition claimed in claim 5.

7. A photosensitive resin printing original plate comprising a support having coated thereon a photosensitive layer comprising the photosensitive resin composition claimed in claim 4.

8. The photosensitive resin composition as claimed in claim 1, which further comprises (F) an aggregation inhibitor.

9. The photosensitive resin composition as claimed in claim 8, wherein the component (F) is a nonionic surfactant.

10. A photosensitive resin printing original plate comprising a support having coated thereon a photosensitive layer comprising the photosensitive resin composition claimed in claim 9.

11. A photosensitive resin printing original plate comprising a support having coated thereon a photosensitive layer comprising the photosensitive resin composition claimed in claim 8.

12. The photosensitive resin composition as claimed in claim 1, wherein at least one member out of the component (B) is an alkyl methacrylate.

13. The photosensitive resin composition as claimed in claim 12, wherein the alkyl methacrylate in the component (B) is a linear alkyl methacrylate having a carbon number of 8 to 18.

14. A photosensitive resin printing original plate comprising a support having coated thereon a photosensitive layer comprising the photosensitive resin composition claimed in claim 13.

15. A photosensitive resin printing original plate comprising a support having coated thereon a photosensitive layer comprising the photosensitive resin composition claimed in claim 12.

16. A photosensitive resin composition layer obtained from the photosensitive resin composition claimed in claim 1, said layer, after photocuring, having a percentage change of 30% or less in the compressive elasticity between before and after dipping in a cosolvent comprising isopropyl alcohol and n-propyl acetate in a weight ratio of 8:2 and having a swelling ratio of 16% or less.

17. A photosensitive resin printing original plate comprising a support having coated thereon a photosensitive layer comprising the photosensitive resin composition claimed in claim 1.

18. The photosensitive resin composition as claimed in claim 1, wherein the ratio of the respective particle diameters at the peaks is 3 times or more.

19. A photosensitive resin printing original plate comprising a support having coated thereon a photosensitive layer comprising the photosensitive resin composition claimed in claim 18.

20. A photosensitive resin composition consisting essentially of
(A) hydrophobic polymers obtained from at least two or more water dispersion latexes,
(B) a photopolymerizable compound, and
(C) a photopolymerization initiator, and optionally at least one component selected from the group consisting of
(D) a hydrophilic polymer,
(E) a viscosity adjusting agent, and
(F) an aggregation inhibitor,
wherein
each of said two or more hydrophobic polymers is present in a fine particle state in the uncured composition,
the particle diameter distribution of the fine particles as the component (A) has two or more peaks, and
the ratio of respective particle diameters at the peaks is 2 times or more.

* * * * *